(12) United States Patent
Sohn

(10) Patent No.: US 7,102,915 B2
(45) Date of Patent: Sep. 5, 2006

(54) SRAM CELL STRUCTURE AND CIRCUITS

(75) Inventor: Jeong-Duk Sohn, Pleasanton, CA (US)

(73) Assignee: ZMOS Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/883,581

(22) Filed: Jun. 30, 2004

(65) Prior Publication Data

US 2005/0018474 A1  Jan. 27, 2005

Related U.S. Application Data

(60) Provisional application No. 60/484,565, filed on Jul. 1, 2003.

(51) Int. Cl.
*G11C 11/00* (2006.01)

(52) U.S. Cl. .................. 365/154; 365/230.05

(58) Field of Classification Search ........... 365/154, 365/230.05, 156, 189.11
See application file for complete search history.

(56) References Cited

U.S. PATENT DOCUMENTS

| | | | |
|---|---|---|---|
| 5,764,566 A | 6/1998 | Akamatsu et al. | |
| 6,091,627 A * | 7/2000 | Luo et al. | 365/154 |
| 6,181,608 B1 | 1/2001 | Keshavarzi et al. | |
| 6,519,204 B1 | 2/2003 | Slamowitz et al. | |
| 6,661,733 B1 * | 12/2003 | Pan et al. | 365/230.05 |
| 6,873,565 B1 * | 3/2005 | Riedlinger et al. | 365/230.05 |
| 6,985,379 B1 * | 1/2006 | Nii | 365/154 |
| 7,009,871 B1 * | 3/2006 | Kawasumi | 365/154 |

* cited by examiner

*Primary Examiner*—Anh Phung
(74) *Attorney, Agent, or Firm*—John P. O'Banion

(57) ABSTRACT

An SRAM circuit structure and method for reducing leakage currents and/or increasing the speed of the devices. Various forms of SRAM devices may be fabricated utilizing the techniques, such as single port and dual port RAM devices. By way of example the SRAM structure utilizes separate write and read lines, splits the circuit into portions which can benefit from having differing threshold levels, and can allow splitting read path transistors for connection to a first terminal and a virtual node connected to a source transistor. The structure is particularly well suited for forming transistors in a combination of NMOS and PMOS, or solely in NMOS. Memory arrays may be organized according to the invention in a number of different distributed or lumped arrangements with the reference read paths and sense blocks being either shared or dedicated.

21 Claims, 8 Drawing Sheets

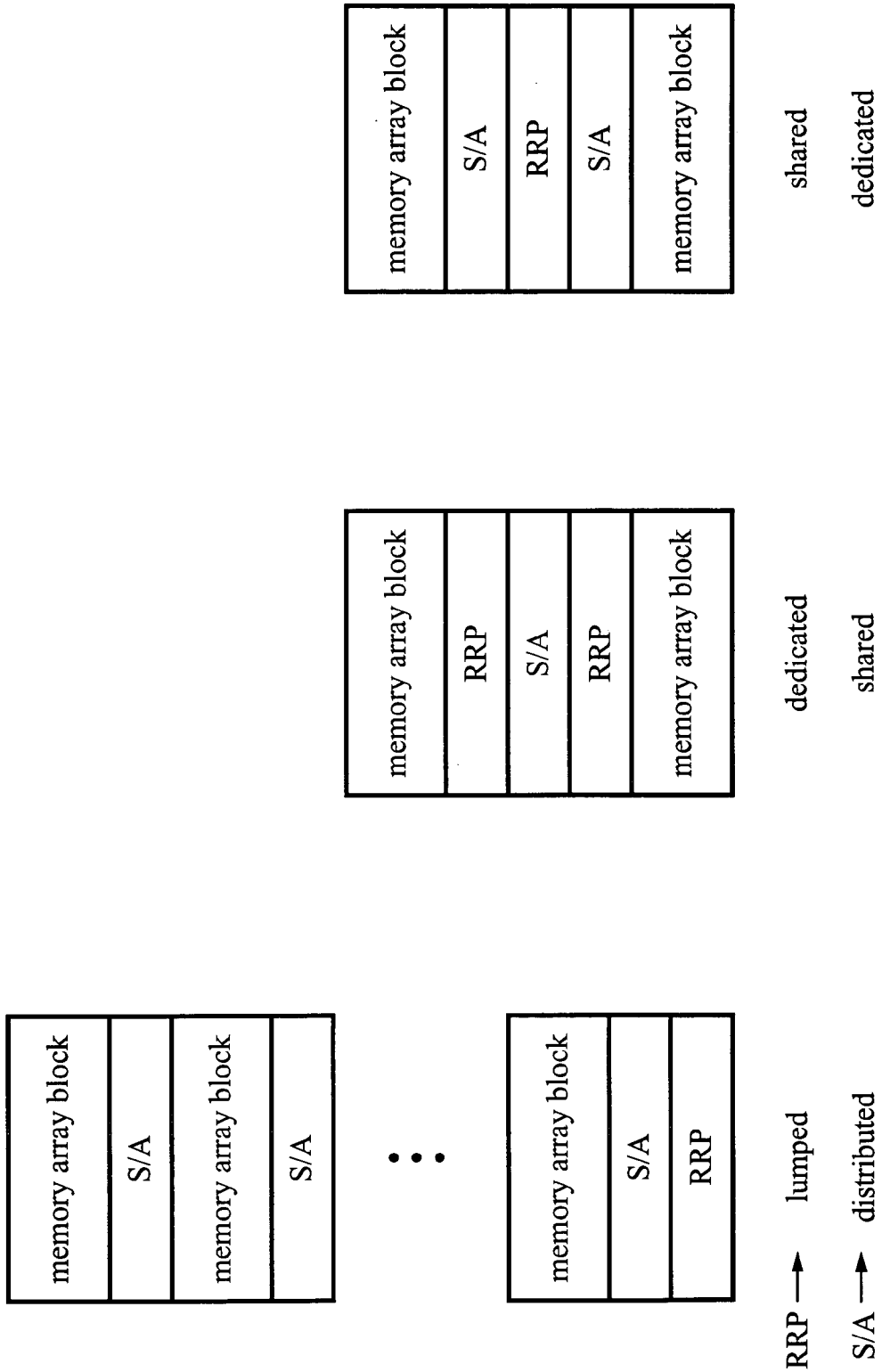

SRAM CELL STRUCTURE AND CIRCUITS

CROSS-REFERENCE TO RELATED APPLICATIONS

This application claims priority from U.S. provisional application Ser. No. 60/484,565 filed on Jul. 1, 2003, incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE INVENTION

1. Field of the Invention

This invention pertains generally to semiconductor memory, and more particularly to static random access memory circuits.

2. Description of Related Art

Static Random Access Memory (SRAM) is a form of electronic data storage which retains data as long as power is supplied. Static RAMs are widely utilized within all manner of electronic devices, and are particularly well-suited for use in portable or hand-held applications, as well as in high performance device applications. In portable or hand-held device applications, such as cell phones, SRAMs provide stable data retention without support circuits, thus keeping complexity low while providing robust data retention. In high performance applications, such as microprocessor caching, since the SRAM can provide fast access times while not requiring the cell data refresh operations required in Dynamic Random Access Memory (DRAM).

FIG. 1 shows a typical SRAM cell consisting of six transistors (6T SRAM) and related peripheral circuits. For example, when node C_j is precharged at $V_{dd}$ (data H), mp2_j is turned off and mn2_j is turned on. Node CB_j is set $V_{ss}$ (data L). Therefore, mp1_j is turned on and mn1_j is turned off. Hence, as long as power is supplied, data at C and CB are maintained high and low respectively.

FIG. 2 shows a read timing diagram of the conventional 6T SRAM cell shown in FIG. 1. In a precharge cycle, PPREi is at logic low and mpp1_i and mpp2_i are turned on. So, bit line pairs (BL_i and BLB_i) are precharged at $V_{dd}$, logic high. When a word line (WL_i) is enabled, a bit line is discharged depending on the stored data. For example, node C_j is high and CB_j is low. According to the word line enabling, mn3_j and mn4_j are turned on. Since CB_j is low and mn2_j is turned on, the voltage of BLBi is discharged slowly through mn4_j and mn2_j. When a certain amount of voltage difference between bit line pairs arises, a sensing enable signal (PSAEi) is enabled to amplify the signal difference. The voltage difference on the bit line pairs is amplified by the sense amplifier (i) and a full CMOS output pairs (Di and Dbi) are generated at the outputs of the sense amplifier.

Since the typical 6T SRAM cell creates a signal difference on bit lines by itself, the read speed of SRAM is faster than that of DRAM, in which a charge sharing time between the bit line and cell capacitances is needed and read speed is slowed. This 6T SRAM cell has a very stable structure and is widely used in typical SRAM design. However, there is a trade-off between power consumption and read speed. As the minimum feature size (i.e. design rule) decreases and the threshold voltage of transistors is reduced to maintain performance as operating voltage is lowered, the leakage current (i.e. standby current) becomes an important factor. In this example, since C_j is at a high level and CB_j is at a low level, mp2_j and mn1_j are turned off. Even though these two transistors are in an off state, there is a current flowing through the devices referred to as a cell leakage current. At 0.18 μm technology, this leakage current is on the order of fA (10e−15) and can be substantially ignored for most applications.

However, with regard to more advanced technology such as 0.13 μm technology, since this current is then on the order of tens of nA (10e−9), the level of current can no longer be ignored. For example, for a 16 Mb SRAM, when a cell leakage current is about 10 nA, the total current is 16*1024*1024*10*1e−9=16 mA. This level of leakage current equates to a large portion of the total power consumption for the device. It should also be appreciated that this leakage current is temperature dependent, increasing in response increasing temperature. For more advanced technology such as 0.11 μm technology, the cell leakage current increases significantly. Therefore, the power consumption component which arises as a result of cell leakage current becomes quite substantial. As the systems relying on SRAM become increasingly complex, the density of SRAM will continue to increase, and the total power consumed by cell leakage currents based on conventional SRAM architectures will continue to increase.

As mentioned earlier, there is a trade-off to be made between power consumption and cell read speed. Since the cell read speed is determined by how fast a bit line node (e.g., CB_j) is discharged through the cell pull-down transistor (mn1_j or mn2_j). Therefore, the sizes of the cell access transistor (mn3_j or mn4_j) and the cell pull-down transistor (mn1_j or mn2_j) need to increase to enhance the read speed. However, when these cell access transistors and cell pull-down transistors increase in size, leakage currents flowing through these transistors also increase. In this example, when these transistors increase in size, leakage current flowing through a pair of mn4_j and mn2_j and mn1_j increases. Therefore, a trade-off between the cell leakage current and the cell read time makes SRAM design complicated and difficult as the operating voltage goes down.

In general, two classes of SRAM cells are implemented depending on the whether the SRAM is used with a low power or high performance application. With regard to low power applications, such as low power hand-held devices, the stand-by current (i.e. power consumption while the chip is in a stand-by mode), is often the most important consideration as these low power portable applications often rely on battery operation wherein stand-by current is a major determiner of battery life. This is in contrast to high performance applications such as cache memory, wherein cell data read speed is of critical importance. However, due to a drastic increase of the cell leakage current, the conventional 6T SRAM cell structure is facing a technical barrier to meet the design requirement. When device sizes increase and the threshold voltage of transistors decreases to meet the required speed, the power consumption due to the cell leakage current is a concern. When device sizes are scaled down and the threshold voltage of transistors increases to suppress leakage current, the cell read speed is degraded due to reduced current driving capability of the cell access and pull-down transistors.

Accordingly, a need exists for advanced SRAM circuits and methods for reducing leakage currents without sacrificing read speed. The present invention fulfills that need and others, while overcoming the drawbacks found in conventional SRAM architectures.

BRIEF SUMMARY OF THE INVENTION

A static random access memory (SRAM) circuit is described which provides reduced leakage currents and high reading speed. The novel architecture described is configured with a novel read sensing structure that can be utilized in combination with differing voltage thresholds for different functional blocks within the device. These aspects of the invention can be utilized separately or in combinations to increase the speed of memory, and/or to lower the power dissipation, such as resulting from the leakage currents.

One embodiment of the invention can be described as a memory device providing static random-access memory, comprising: (a) a static memory cell structure having a plurality of data latches; (b) a plurality of functional blocks within the cell structure including read, write and storage. By configuring at least one of the functional blocks, such as the read word circuit and/or the write word circuit, for a lower threshold voltage the leakage current for the device can be substantially reduced. In one embodiment the read word signal and write word signal are separated. An embodiment is described in which data is read through read transistors activated by the read lines whose outputs drive alternating bit lines on successive words. A sense amplifier provides differential sensing of the bit lines to drive the output data.

Another embodiment of the invention can be described as a memory device having a static random-access memory configuration, comprising: (a) a plurality of static memory cells, such as formed from data latches; (b) a plurality of word lines for the read path; (c) a plurality of word lines for the write path; (d) a plurality of functional blocks including read, write and storage. At least one of the functional blocks is preferably configured to have different voltage threshold conditions than the other functional blocks. In one embodiment a reference path circuit provides a virtual node to which read path transistors are connected between different bit lines, wherein the read lines are sensed using differential sensing by a sense amplifier, such as for suppressing leakage current of cell blocks.

Another embodiment of the invention can be described as a semiconductor memory circuit comprising: (a) a plurality of static memory storage functional blocks (cells) having a plurality of data latches configured for being read and written; (b) a memory cell reading transistor functional block having an input coupled to each storage functional block and an output coupled to one of at least two bit lines; and (c) a sense amplifier coupled between the bit lines for detecting data being read from said data latches in response to differential sensing between said bit lines. Furthermore, the read and write functional blocks can be configured with lower voltage thresholds than the memory latch transistors, while in another variation the voltage threshold of the read transistors is designed to have a lower threshold than the write transistors.

The invention may also be described in terms of a method of accessing cells of a static memory, comprising: (a) maintaining data written to transistors of a first voltage threshold level forming a data latch for a static memory cell; (b) applying a read word signal to activate read word transistors of a second voltage threshold which is less than first voltage threshold; and (c) sensing the output of the read word transistors in a sense amplifier coupled to a bit line to generate a data bit output.

The invention may also be described in terms of a method of accessing cells of a static memory, comprising: (a) maintaining data written to transistors forming a data latch for a static memory cell; (b) applying a read word signals to activate read word transistors; and (c) sensing the output of the read word transistors in a sense amplifier coupled between bit lines to generate a data bit output. Furthermore, functional blocks within the static memory can be configured with lower voltage thresholds, such as the read block, or the read and write blocks, wherein faster speeds and lower leakage currents can be exhibited by the circuit.

A number of aspects are described for the present invention, including but not limited to the following.

An aspect of the invention is an SRAM cell structure which has a plurality of functional blocks, the functional blocks including read, write and storage, wherein each functional block can have different threshold voltages.

Another aspect of the invention is an SRAM cell in which the read path has a lower threshold voltage than that of storage and write path.

Another aspect of the invention is an SRAM cell in which the read path has the lowest design threshold, the write path has a medium design threshold and the storage path has the highest design threshold voltage.

Another aspect of the invention is an SRAM cell structure in which one terminal of read path transistors are connected together with one terminal of alternating read path transistors and to a virtual node which is connected to a source transistor to suppress leakage current of cell blocks.

Another aspect of the invention is an SRAM structure which has separate functional blocks and independent word lines for read and write paths.

Another aspect of the invention is an SRAM structure which has separate functional blocks and the same word line for read and write paths.

Another aspect of the invention is a reference read path scheme with a PMOS source transistor.

Another aspect of the invention is a reference read path scheme with an NMOS source transistor.

Another aspect of the invention is the architecture for the placement of reference read paths (RRPs) and sense amplifiers (SAs) in distributed, lumped, or mixed configurations.

Another aspect of the invention is the architecture for the utilization of either shared or dedicated reference read paths (RRPs) and sense amplifiers (SAs).

Another aspect of the invention is an ability to implement various forms of SRAM memory such as multi-port SRAM, embedded forms of SRAM, and so forth according to the teachings of the present invention.

Further aspects of the invention will be brought out in the following portions of the specification, wherein the detailed description is for the purpose of fully disclosing preferred embodiments of the invention without placing limitations.

BRIEF DESCRIPTION OF THE SEVERAL VIEWS OF THE DRAWING(S)

The invention will be more fully understood by reference to the following drawings which are for illustrative purposes only:

FIGS. 5A–5F are block diagrams of SRAM memory organizations according to embodiments of the present invention, showing the placement of reference and read paths.

DETAILED DESCRIPTION OF THE INVENTION

Referring more specifically to the drawings, for illustrative purposes the present invention is embodied in the apparatus generally shown in FIG. 3 through FIG. 6. It will be appreciated that the apparatus may vary as to configuration and as to details of the parts, and that the method may vary as to the specific steps and sequence, without departing from the basic concepts as disclosed herein.

The new SRAM cell structure and related sensing scheme are configured for overcoming a number of the problems which arise with conventional SRAM architectures. One improvement is an architecture in which specific functional blocks can be designed with different threshold voltages to control leakage. For example, the transistors of the read circuit being configured with a lower voltage threshold than the storage transistors. As a second example, the write circuit is configured with a lower voltage threshold than the storage transistors, and the transistors of the read circuit are configured with a lower threshold than the write circuit transistors. It will be appreciated that the inaccuracies in fabrication lead to small differences in threshold voltages between devices, however, these slight random variations are not what is being addressed herein. In the present invention, the differences in threshold voltages are in response to the design of the transistors being fabricated, and the difference in threshold is preferably over about five to ten percent.

Figure 1:
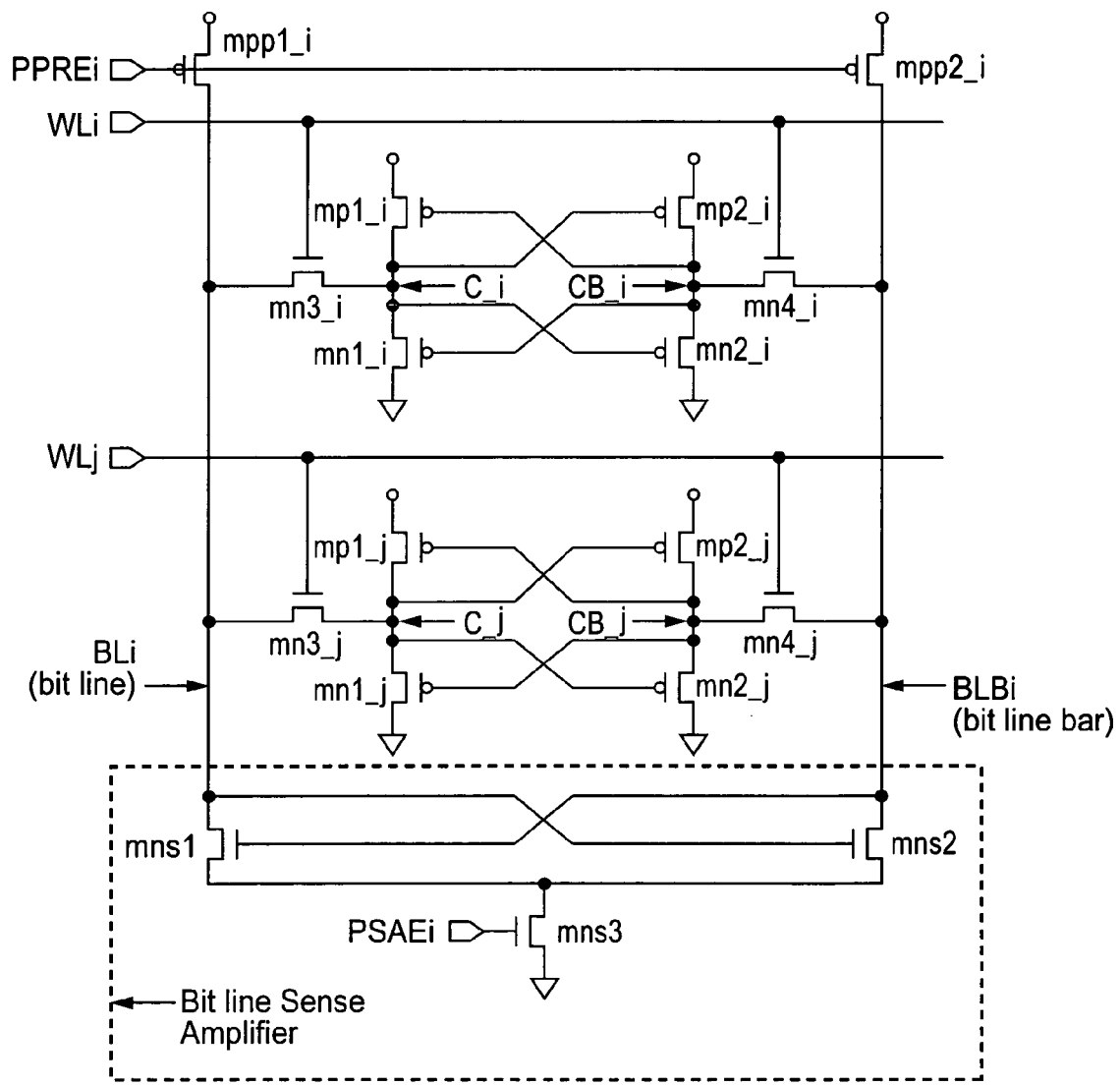
FIG. 1 is a schematic of a conventional 6T SRAM cell and peripheral circuits.
Figure 2:
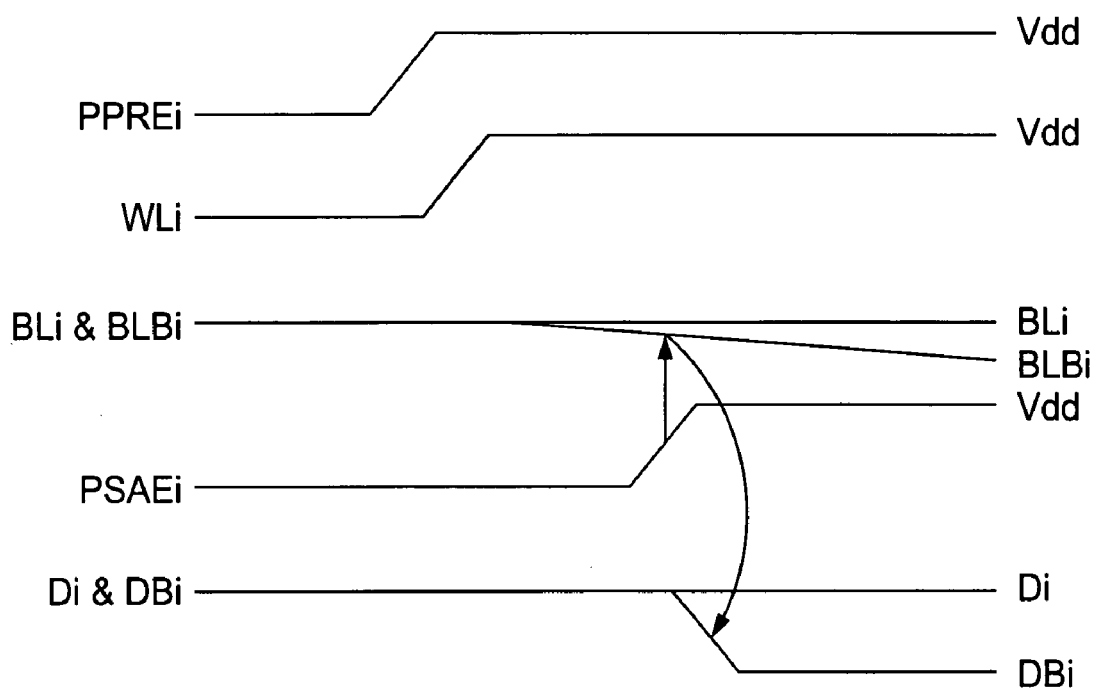
FIG. 2 is a timing diagram for the conventional 6T SRAM cell of FIG. 1.
Figure 3:
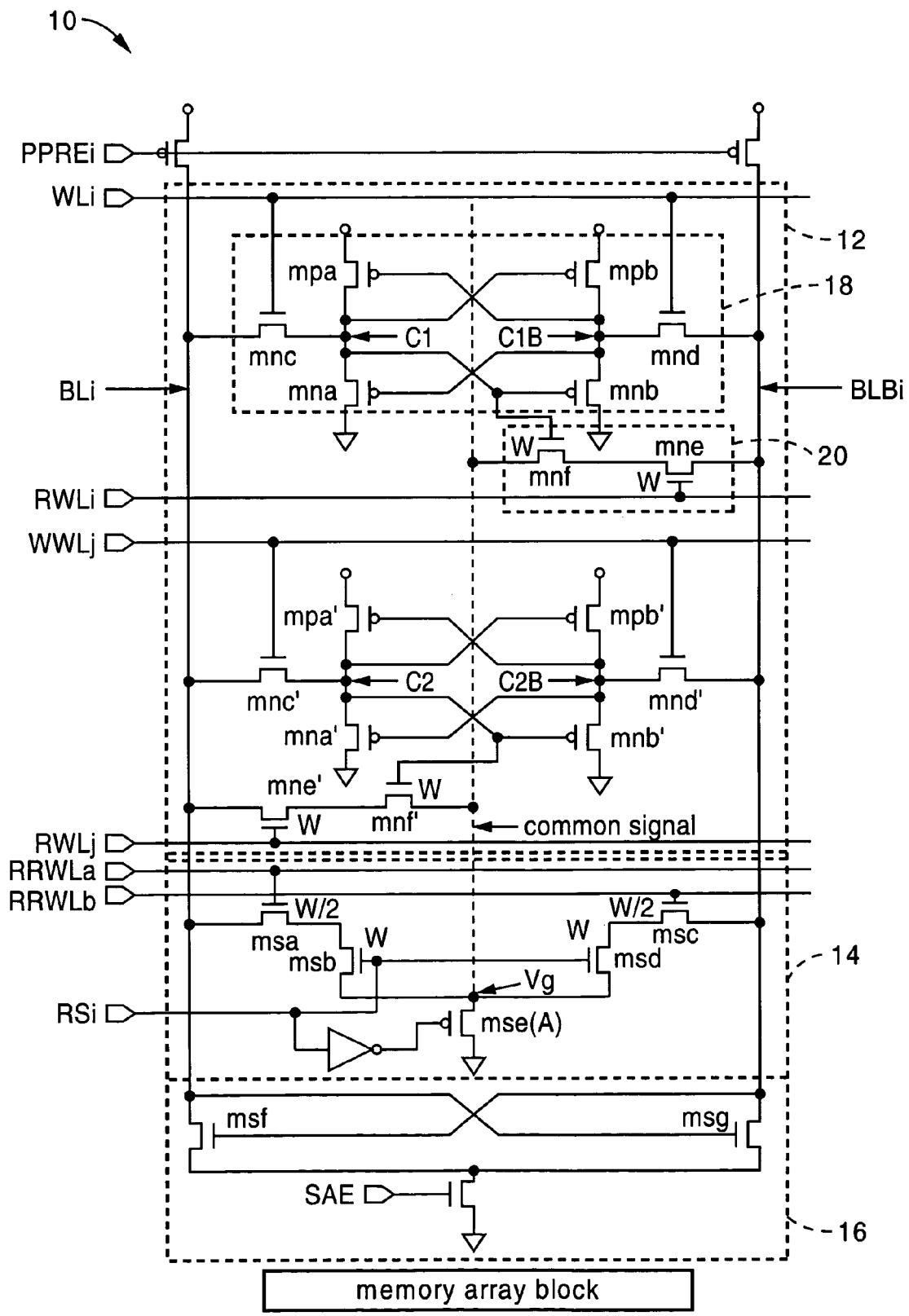
FIG. 3 is a schematic of an SRAM cell structure according to an aspect of the present invention, shown with sensing circuitry and circuits for controlling cell leakage current.

FIG. 3 illustrates an example embodiment 10 of a new SRAM cell structure and related sensing scheme according to the present invention. The new cell structure can be utilized within any size of memory block (i.e. 128WL× 256BL). The new structure comprises storage cells 12 (data latches), a reference read path 14 and a sense amplifier 16. Unlike the conventional six transistor SRAM cell structure shown in FIG. 1, the new SRAM cell shown in FIG. 3 comprises eight transistors (mpa, mpb, mna–mnf). Six transistors (mpa, mpb and mna–mnd) are used to store the cell data and a write path to change the cell data while two transistors (mne, mnf) are used for the cell read operation. The source of the cell read transistors (mne, mnf) are connected together with that of adjacent cell read transistors and are linked to a sense amplifier. The source node of all transistors in the entire memory block or part of the entire memory block can be connected together depending on different design targets.

In this embodiment the logic threshold voltage levels are shown with storage cell 18 having a normal or high voltage threshold, for the given operating voltage, while the cell read transistor section 20 is configured with a lower voltage threshold.

In a precharge state, when WWLi (write word line) and RWLi (read word line) are at logic low, mnc, mnd and mne are turned off. When C1 is at a high level and C1B is low, mpb and mna are turned off and mpa and mnb are turned on. Thereby, the data C1 and C1B are maintained. Since RWLi is low, mne is off and there is no current path through mne and mnf from a bit line (BLBi) even though this bit line is precharged at $V_{dd}$ which is similar to that of FIG. 1.

One of the differences between the embodied cell structure and conventional cell structures is the use of separate paths for read and write operations. In the conventional structure, the cell access transistor and the pull-down transistor need to be large for fast read and write operation. However, in that case the cell leakage current becomes a concern. In the new cell structure of the present invention, since the read (mne and mnf) and write paths (mnc and mnd) are preferably separate and the storage portion of the circuit (mpa, mpb, mna and mnb) are isolated from the read path, a fast read speed is achieved along with a significantly suppressed cell leakage current.

In the conventional cell structure, the cell transistors cannot be readily configured to support different threshold voltages due to a trade-off between leakage current and the cell read speed. When the cell transistors have a high threshold voltage to suppress the cell leakage current, the cell read speed is degraded due to the reduced current driving capability of transistors, especially the cell access and pull-down transistors. However, in the new cell structure of the present invention, the threshold voltage of transistors can be controlled more adaptively. For example, the storage block transistors (mpa, mpb, mna and mnb) and the cell access transistors (mnc and mnd) are preferably configured as high threshold voltage elements to suppress the leakage current since these parts are not related with the cell read operation. Instead, the cell read transistors (mne and mno are configured to have lower threshold voltages to improve cell read speed.

In the new cell structure of the present invention, each section of the circuit can be configured with different threshold voltages to meet design requirements. By way of example, the threshold voltages of the storage part (storage functional block) and the write path (write functional block) can be configured at higher threshold levels than that of the cell read path (read functional block). By establishing the different threshold levels the cell leakage current through the turned-off transistors of the storage part and the cell access transistors from the bit lines can be suppressed significantly while the cell read speed can be improved. It should be appreciated that the leakage current of the transistor is reduced exponentially in response to increasing the threshold voltage of the transistor. Therefore, the circuit can utilize different threshold voltages, such as for the storage part and the read and write access transistors, to arrive at a range of desired characteristics for the SRAM device. The SRAM cell structures depicted in FIG. 3 having three separate functional blocks, storage, write and read paths. Due to the design of the present SRAM each of these functional blocks can be designed with transistors having different threshold voltages depending on the design requirements.

Another important aspect of the invention is a sensing scheme related with the cell structure explained above. In the inventive cell scheme, the read path is connected to one of the bit lines. For example, in the top cell, the read transistors are connected to the bit line bar (BLBi) and for the next cell below, the read transistors are connected to the bit line (BLi). Therefore, the sensing scheme to detect the signal difference on the bit line pairs is also important. The bit line sensing scheme can realize two important design requirements, suppressing leakage current through the read transistors and increasing the speed by which signal differences on the bit line are sensed. It should be noted that the common signal BLi is preferably placed only in the sub-memory block or connected to the entire block. Sense amplifier 16 may be placed in respect to the bit line or shared with multiple bit lines.

A principle objective of the present invention is to suppress leakage current in the storage portion and the write path by using smaller transistors with higher threshold voltages than utilized in conventional SRAM cell structures. A separate read path is also preferably utilized which has a lower voltage threshold than utilized in the storage cell. There is another current path in the new cell, which is related with the read transistors. When the bit line pairs are pre-charged to $V_{dd}$ as in the conventional cell structure shown in FIG. 1, even though one of the read transistors is off since the read word line (RWLi) is low, there is also leakage current flowing through these transistors. For example, C1 is set $V_{dd}$, mnf is turned on but mne is turned off since RWLi is low. However, a leakage current through transistor mne flows even though this transistor is turned off.

In one embodiment of the present invention, SRAM cell read speed is aided by increasing the size of the read transistors to about four times the conventional sizing. According to the invention, the read transistors are configured with a lower threshold voltage to improve the read speed, the leakage current flowing through the read path is much larger than that flowing through other parts. Therefore, the new sensing scheme related with the new SRAM cell structure can suppress the leakage current flowing through the read path.

One way to further suppress the leakage current is to configure the bit lines as floating in a precharge state, which results in eliminating the power supply source from the bit line. That is, the bit line precharge transistors (mpp1_i and mpp2_i) are turned off during the precharge state and then are activated prior to the read operation by setting the bit lines to $V_{dd}$ as in the conventional scheme. Although this structure can suppress leakage current, a problem arises with so-called "bit-line hurting" to the cell, during the write operation. When there is no power supply, the voltage of bit lines are virtually ground due to junction leakage current. When the write word line (WWLi) is enabled, transistors mnc and mmd are turned on and node C1 and CB1 are connected to bit lines BLi and BLBi, respectively. Since the bit line capacitance is substantially larger than that of cell transistors, around twenty times larger, when the write transistors are switched on, node C1 and C1B are discharged due to a charge sharing effect until node C1 is restored by transistor mpb. Since node C1 is high and node C1B is low, the degree of discharging is different. So, in the ideal case, even though node C1 and C1B is discharged due to charge sharing effect, node C1 is discharged less and due to signal difference on node C1 and node C1B, the voltage of C1 and C1B can be eventually restored to $V_{dd}$ and $V_{ss}$.

However, in the case of mismatches in transistor size and threshold voltages, a different situation can occur. For example, node C1 can be discharged more or less, the stored data information can be changed, because the threshold voltage of transistor mpb is lower than that of transistor mpa due to fabrication process variation. That is, data on node C1 and node C1B can be changed from high and low to low and high, respectively. This is a possibility which can occur in the new cell structure of the present invention.

There are additional things to consider regarding sensing operations when the bit line is floating. For instance, in order to eliminate a mismatch in the voltage of the bit line pair, it is necessary to perform an extra precharge operation to assure that invalid sensing does not arise. This extra operation represents a speed penalty as it delays the actual sensing process. The new cell structure of the present invention does not require the use of this extra precharge operation.

The embodiment shown in the figure (FIG. 3) provides a novel sensing scheme which doesn't require the precharge operation mentioned above and which can suppress the leakage current flowing through the read transistors.

The sense amplifier scheme which eliminates the precharge operation and suppresses leakage current, can be implemented utilizing a new novel circuit incorporating what is referred to herein as a reference read path. The main idea of the reference read path is to provide a current path having current driving capability equal to about half that of the cell read transistors.

In fabricating the SRAM device embodiment shown in FIG. 3, the width of each cell read transistor is 'W' as shown by the area of cell read section 20 surrounded by the dotted lines. Wherein two transistors having width of W are stacked and the drain of two stacked transistors is connected to a bit line and the source of two stacked transistors is connected to a virtual ground signal which is also connected to the source of two stacked transistors in other SRAM cells.

In the top cell of FIG. 3, mne and mnf are two stacked transistors having width of 'W', wherein one terminal of transistor mne is connected to BLBi and one terminal of transistor mnf is connected to a virtual signal $V_g$, shown represented as a dotted line interconnecting the two cell read sections with transistor mse(A). The other terminal of the two transistors, mne and mnf, are connected with each other. The virtual signal line is connected to a source transistor, mse, which is turned-on in read operations depending on input condition. In the reference read path two transistors, (e.g., msa, msb, msc and msd) are stacked. One terminal of each pair of transistors is connected to each bit line. For example, the drain of transistor msa is connected to BLi, and the source of transistor msb is connected to $V_g$, which is at the drain of source transistor mse. The other two terminals of transistors msa and msb are connected together. The gate of transistor msa is connected to reference read word line (RRWLa) and the gate of transistor msb is connected to a read signal (RSi). Transistors msb, msc and msd are shown placed similarly to transistor msa. The drain of transistor msc is connected to bit line BLBi and the source of transistor msd is connected to the virtual ground signal $V_g$. The source of transistor msc and the drain of transistor msd are connected together. The gate of transistor msc is connected to another reference read word line signal (RRWLb) and the gate of transistor msd is connected to the read signal (RSi). RRWLa and RRWLb are enabled selectively with address information, or enabled when the read path at the other line is enabled (i.e. RWLi is selected when RRWLa is selected).

It should be noted that RRWLb and RRWLa are enabled selectively with address information and are enabled when the read path on the other line. is enabled (i.e. RWLi is selected when RRWLa is selected). The source of the source transistor mse is connected to the source of transistors msb and msd, while its gate is connected to the read signal RSi and the drain of source transistor mse is connected to a power source $V_{ss}$. Note that the source transistor mse is a PMOS transistor in this example, however an NMOS transistor may be alternatively utilized. The order of stacked transistors, msa, msb, msc and msd, can be changed according to design implementation without departing from the invention.

The width of stacked transistors in the normal cell is 'W', but the width of a transistor (i.e. msa) is 'W/2'. It means that current driving capability of stacked transistors in the reference read path is half of stacked transistors in the normal cell. Actually, the current driving capability of stacked transistors is not exactly half of stacked transistors in the normal cell but it is required to have smaller current driving capability of stacked transistors in the normal cell. The sizing of transistors in the reference read path is determined according to the desired operation (i.e. half that of read path transistors).

Figure 4A:
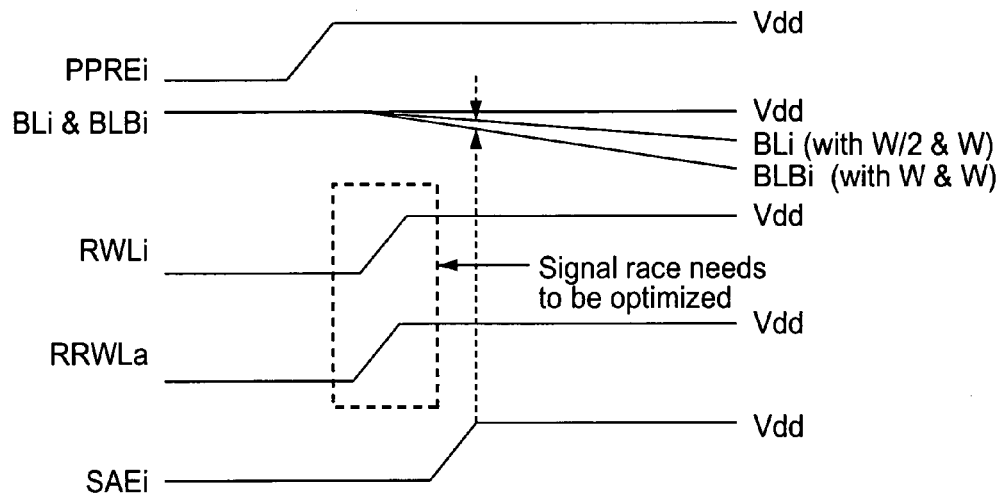
FIGS. 4A–4D are timing diagrams for the SRAM cell shown in FIG. 3.
Figure 4B:
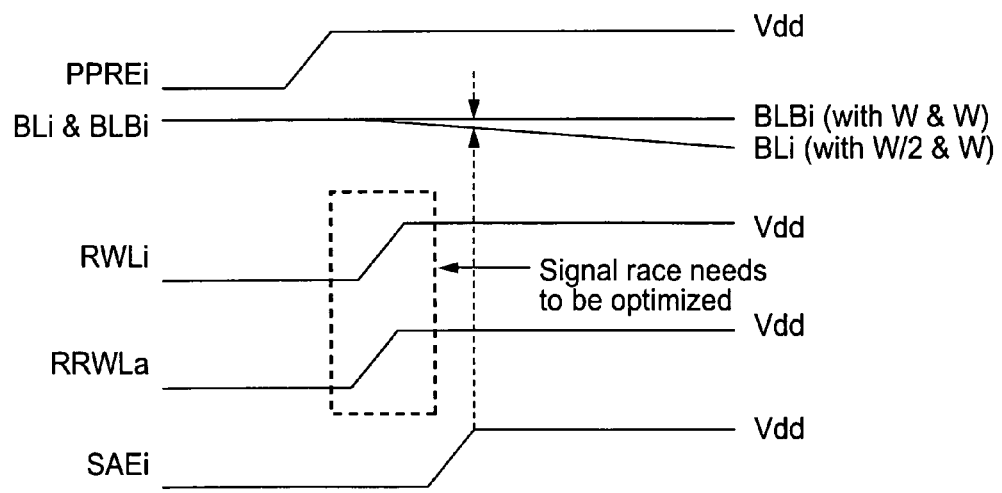

FIG. 4A through FIG. 4D illustrate timing aspects of the new sensing scheme. FIGS. 4A–4B depict sensing timing when RWLi is enabled. FIG. 4A depicts the case when C1 is high and C1B is low, while FIG. 4B depicts C1 being low and C1B being high.

In a precharge cycle, bit line pairs are set to a voltage, typically $V_{dd}$.

When a word line (i.e. RWLi) is enabled the data of C1 is high and C1B is low (FIG. 4A) wherein transistor mnf is turned on. There is a current path established through transistor mne and mnf from BLBi. The stacked transistors connected to BLi are selected in the cell that has the read transistors connected to BLBi. In other words signal RRWLa is enabled to turn on transistor msa. To read the cell data, read signal RSi is enabled.

When WWLi, RRWLa and RSi are enabled, bit lines discharge at different rates seen as the varying slopes of BLi and BLBi. Note that the width of transistor mnf is 'W' while that of transistor msa is 'W/2'. Therefore, the discharging slope of BLBi is faster as shown in FIG. 4A than in FIG. 4B due to its larger transistor size and larger current driving capability. Hence, the signal difference on the bit lines is developed when the cell is selected.

When the data of C1 is low, as a result of transistor mnf being turned off, there is no current path through stacked transistors from the bit line bar.

Therefore, BLBi remains high and only the bit line, BLi, is discharged through the reference current path, msa and msb. Hence a signal difference on the bit lines is developed.

Figure 4C:
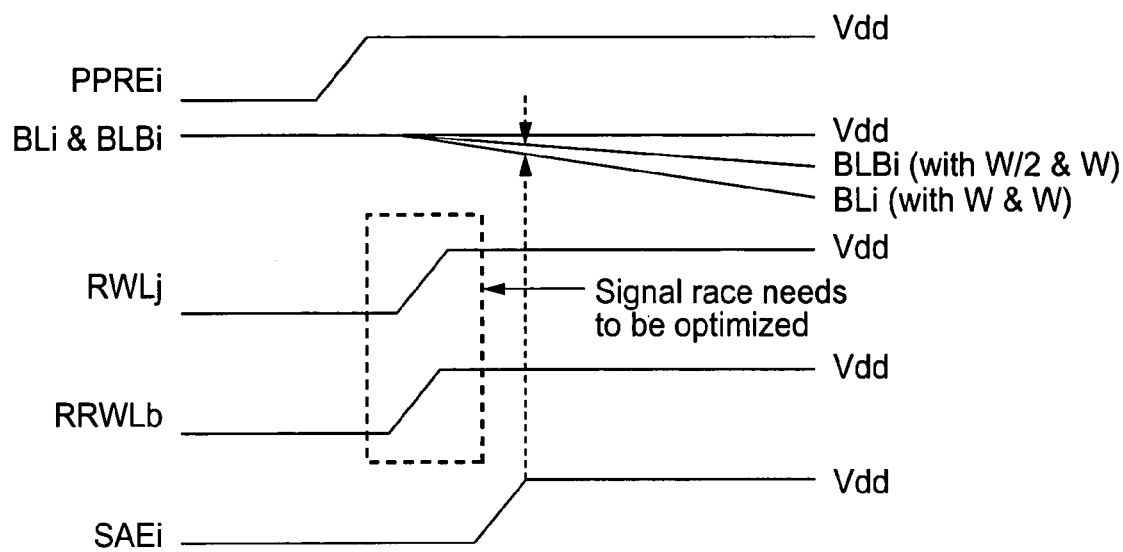
Figure 4D:
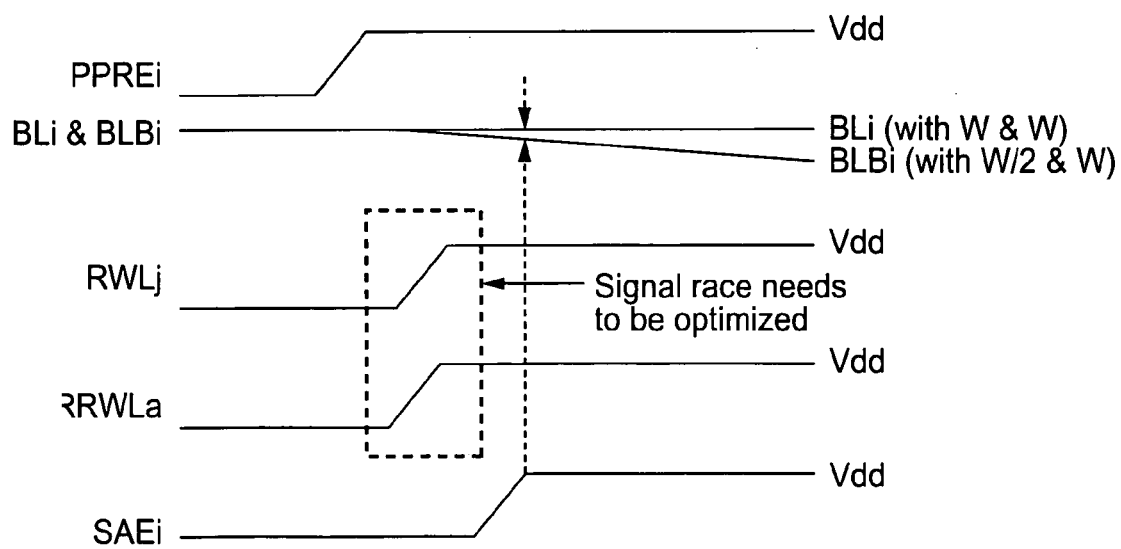

FIGS. 4C–4D depict sensing timing when RWLj is enabled. FIG. 4C depicts the case when C2 is low and C2B is high, while FIG. 4D depicts C2 being high and C2B being low.

When the other cell having the cell read transistors connected to the other bit line is enabled, the stacked reference current path is selected to develop a signal difference on the bit lines. For example, when RWLj is enabled and the data of C2 is low and C2B is high, transistor mnf' is turned on and there is a current path through transistors mne' and mnf'. Since the cell having stacked transistors is connected to BLi, the stacked transistors connected to BLBi are selected. That is, when RWLj is enabled, RRLWb is enabled and transistor msc is turned on. When the read signal, RSi, is enabled, a current path through transistors msc and msd from BLBi is formed to discharge BLBi. As explained earlier, due to smaller current driving capability of stacked transistors in the reference path, the discharging slope of BLBi is slower than that of BLi and there is a signal difference on bit lines.

When the data of C2 is high and C2B is low, mnf' is turned off and there is no current path through mne' and mnf'. Only the bit line bar, BLBi, is discharged through msc and msd. A signal difference is developed on the bit line pairs.

Since the virtual ground signal $V_g$ is connected to the source transistor, the amount of leakage current of the cell is not the sum of the leakage current flowing through turned off read transistors of each cell but is limited by the leakage current of the source transistor mse.

It will be appreciated that the above describes read word lines activating transistors coupled to the bit lines for developing signal differences on the bit lines for detecting memory storage cell state. This sense amplifier scheme can suppress leakage current significantly. In this example, the use of a PMOS source transistor mse reduces leakage current by making all transistors in the reference read path reverse-biased. In the active mode, when RSi signal is enabled, the voltage of $V_g$ is discharged to $V_{tp}$, where $V_{tp}$ is the threshold voltage of the source PMOS transistor. When RSi goes to low in the standby mode or when the related cell is not selected, such as when RRWLa and RRWLb are low and RSi is also low, the gates of msa, msb, msc and msd are low and the gate of the PMOS source transistor mse goes to high. Since the voltage of $V_g$ is $V_{tp}$, $V_{gs}$ of msb and msd is $-V_{tp}$, which means that transistors msb and msd are reverse-biased. Since the gate voltage of the PMOS source transistor mse is $V_{dd}$ and the source voltage is $V_{tp}$, $V_{gs}$ of transistor mse is $V_{dd}-V_{tp}$, which also means that the source transistor mse is reverse-biased. Since the voltage of $V_g$ is $V_{tp}$, the voltage of the source of transistor msa and the drain of transistor msb and the voltage of the source of transistor msc and the drain of transistor msd are also positive voltages.

Since the gate voltage of transistors msa and msc is low, $V_{gs}$ of transistors msa and msc is a negative voltage, which means that these two transistors are reverse-biased. Even when one of the reference word lines, such as RRWLa or RRWLb, is high when RSi is low, transistors msb, msd and mse are reverse-biased. Therefore, the leakage current flowing through transistors in the reference read path is suppressed significantly.

One issue related with the reference read path above is the use of different types of MOS transistors. One embodiment can be created with transistors for carrying the reference current being NMOS transistors, while the source transistors are PMOS transistors. However, creating a PMOS transistor requires an NWELL structure which results in an area penalty. To solve this problem, the PMOS source transistor can be replaced by an NMOS transistor. In this case, all transistors in the reference read path have the same type, the area penalty due to the formation of NWELL for PMOS transistors can be minimized. In case of the NMOS source transistor, when the gate voltage is low to turn off the source transistor, since the source of the NMOS source transistor is $V_{ss}$, $V_{gs}$ of the NMOS transistor is about zero volts instead of a negative voltage. Therefore, the leakage current flowing through the reference read path can be increased somewhat, however, it is still much smaller since the leakage current of the cell block is limited by that of this NMOS source transistor.

A principal objective of the inventive sensing scheme is to have a reference read path which can be selected alternatively, that is, a current path is formed from a bit line in the normal cell and a reference current path is formed from the other bit line to develop a signal difference by different current driving of each current path.

When a signal difference is developed on the bit lines, the sensing enable signal SAE is enabled to amplify the signal difference. A reference read path is placed per a pair of bit lines or can be shared by multiple bit line pairs. A sense amplifier is also positioned by a pair of bit lines or can be shared by multiple bit line pairs. It should be appreciated that the novel SRAM device can be implemented with a number of sense amplifier structures without departing from the teachings of the present invention.

Figure 5C:
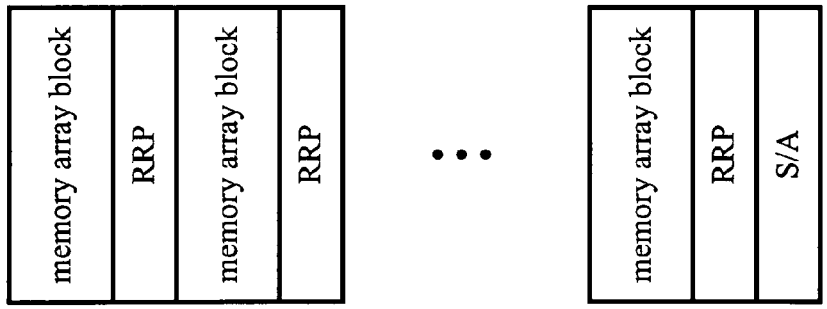
Figure 5B:
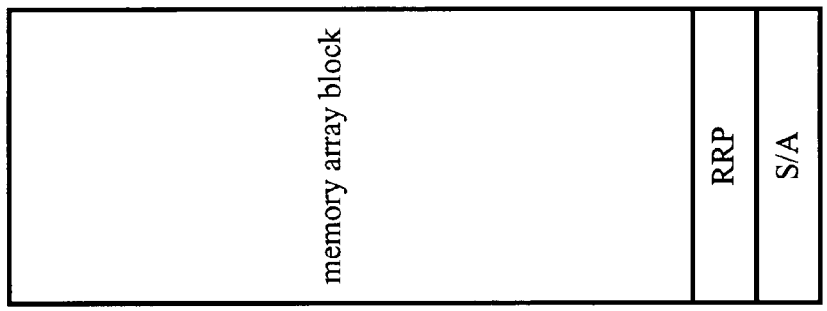
Figure 5A:
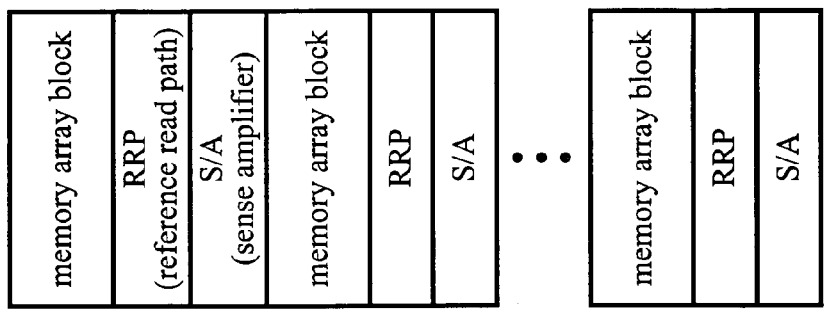

FIG. 5A through FIG. 5F illustrate by way of example embodiments having different arrangements for the placement of the reference read path and sense amplifiers. In FIG. 5A the reference read path is shown placed per small memory block (distributed) or per a memory block which is controlled by the address decoder (lumped). The sense amplifier is also placed per smaller (sub) memory block (distributed) or per a whole memory block (lumped), as shown in FIG. 5B. The reference read path and the sense amplifiers can be placed in a distributed form as in FIG. 5C or a lumped form as depicted in FIG. 5D. The sense amplifier can be shared by multiple reference read paths as shown in FIG. 5E or the reference read path can be shared by multiple sense amplifiers as depicted in FIG. 5F. It should be recognized that combinations of the above may be implemented and that variations can be introduced by one of ordinary skill in the art according to the teachings herein without departing from the present invention.

Another aspect of the invention provides a sensing scheme for the cell structure which has a read path only from one bit line. The inventive sensing scheme contains a reference read path which can provide a reference current to make a signal difference on the bit lines. The reference read path can provide a different current driving capability to eliminate an unnecessary precharge step and to generate a signal difference on the bit lines. The reference read path can be any structure to provide a reference current to develop a signal difference on bit lines.

Figure 6:
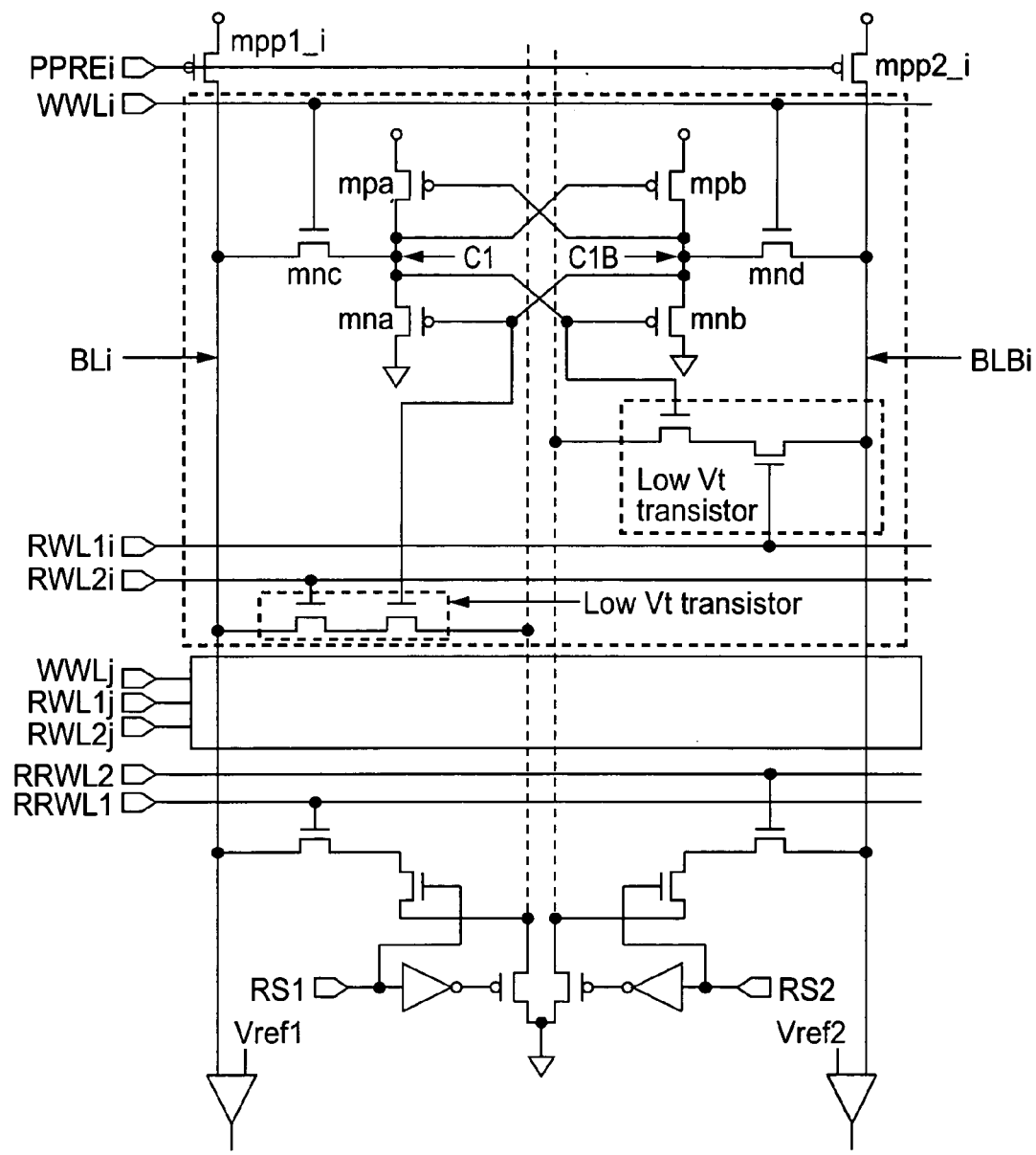
FIG. 6 is a schematic of a dual-port SRAM cell structure according to an aspect of the present invention, showing sensing circuitry and circuits for controlling cell leakage current.

FIG. 6 depicts a dual-port SRAM variation of the SRAM previously described. It can be seen from the schematic that the reference line is split and that two separate sense circuits are provided with the dual data outputs generated from comparisons against $V_{ref1}$ and $V_{ref2}$ thus providing two separate outputs. It can also be seen in the figure that the functional blocks of the circuit are configured with different voltage thresholds, for example the read sensing blocks are shown incorporating low $V_t$ transistors, which have a lower voltage threshold than the transistors of the static memory latch to reduce leakage while increasing speed. It should be appreciated that numerous similar variations of the present invention can be implemented without departing from the teachings herein.

The present invention provides new cell structures for SRAM devices and the like. The structures can incorporate separate functional blocks for write paths, read paths and storage which are preferably designed with different threshold voltages to suppress leakage current in the storage part while improving read speed. The use of separate read and write word lines is also described for reducing power requirements and facilitating low leakage read operations. A form of differential read sensing is also described in which one terminal of stacked transistors is connected to a bit line and another terminal is connected to a virtual source node which is connected to a source transistor to suppress the total leakage current of memory cell block.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A semiconductor memory circuit, comprising:
   a plurality of static memory storage functional blocks having a plurality of data latches forming memory cells configured for being read and written;
   a memory cell reading transistor functional block having an input coupled to each storage functional block and an output coupled to one of at least two bit lines; and
   a sense amplifier coupled between said at least two bit lines for detecting data being read from said data latches in response to differential sensing between said bit lines.

2. A semiconductor memory circuit as recited in claim 1, wherein said differential sensing is performed in reference to a reference read line which is connected to said sense amplifier and a source transistor.

3. A semiconductor memory circuit as recited in claim 1, further comprising a memory cell writing functional block configured for writing data into one of said storage functional blocks.

4. A semiconductor memory circuit as recited in claim 3, wherein said read and/or write functional blocks are designed with lower voltage thresholds than the storage functional blocks.

5. A semiconductor memory circuit as recited in claim 3, wherein said cell structure utilizes separate word lines for the read and write paths.

6. A semiconductor memory circuit as recited in claim 5, wherein said read word lines activate transistors coupled to said bit lines for developing signal differences on the bit lines for said differential sensing.

7. A semiconductor memory circuit as recited in claim 6, wherein one group of read path transistors are connected together with another group of read path transistors to a reference read line, which is connected to a sense amplifier and a source transistor to suppress leakage current of cell block.

8. A semiconductor memory circuit as recited in claim 3, wherein said memory cells are configured with separate functional blocks utilizing either the same word lines, or utilizing separate word lines for the read and write paths.

9. A semiconductor memory circuit as recited in claim 1, wherein said sense amplifier has a read path as either a distributed or lumped configuration.

10. A semiconductor memory circuit as recited in claim 1, wherein said sense amplifier has a read path which is configured for shared or dedicated utilization within the memory device.

11. A semiconductor memory circuit memory as recited in claim 1, wherein the current driving or discharging capability of a read path for said sense amplifier is different than the current driving or discharging capability of a read path in said memory cells.

12. A method of accessing cells of a static memory, comprising:
maintaining data written to transistors forming a data latch for a static memory cell;
applying a read word signal to activate read word transistors; and
sensing the output of the read word transistors in a sense amplifier coupled between bit lines and configured to generate a data output in response to differential sensing between said two bit lines.

13. A method as recited in claim 12, further comprising generating a reference read line for referencing the read word signals coupled to said bit lines.

14. A method as recited in claim 12, further comprising configuring the read word transistors with a lower voltage threshold than said transistors of said data latch.

15. A method as recited in claim 12, further comprising applying a write word signal to activate write word transistors for writing data into said data latch.

16. A method as recited in 15, further comprising configuring the write word transistors with a lower voltage threshold than said transistors of said data latch.

17. A method as recited in claim 16, further comprising configuring the write word transistors with a higher voltage threshold than said transistors of said read word transistors.

18. A method as recited in claim 12, wherein said sense amplifier has a read path as either a distributed or lumped configuration.

19. A method as recited in claim 12, wherein said sense amplifier has a read path which is configured for shared or dedicated utilization within the memory device.

20. A method as recited in claim 12, wherein the current driving or discharging capability of a read path for said sense amplifier is different than the current driving or discharging capability of a read path in said memory cells.

21. A method as recited in claim 12, wherein said memory cells are configured with separate functional blocks utilizing either the same word lines, or utilizing separate word lines for read and write paths.

* * * * *